United States Patent [19]

Ishikawa

[11] Patent Number: 5,177,026
[45] Date of Patent: Jan. 5, 1993

[54] METHOD FOR PRODUCING A COMPOUND SEMICONDUCTOR MIS FET

[75] Inventor: Takahide Ishikawa, Itami, Japan

[73] Assignee: Mitsubishi Denki Kabushiki Kaisha, Tokyo, Japan

[21] Appl. No.: 686,831

[22] Filed: Apr. 17, 1991

Related U.S. Application Data

[62] Division of Ser. No. 528,850, May 25, 1990, abandoned.

[30] Foreign Application Priority Data

May 29, 1989 [JP] Japan .................. 1-135277

[51] Int. Cl.$^5$ ............................... H01L 21/265
[52] U.S. Cl. .................... 437/39; 437/912; 437/944
[58] Field of Search .......... 357/22 I, 22 K, 22, 357/22 A, 22 MD, 22 P; 437/184, 39, 912, 944; 148/DIG. 100

[56] References Cited

U.S. PATENT DOCUMENTS

| | | | |
|---|---|---|---|
| 4,410,903 | 10/1983 | Wieder | 357/22 A |
| 4,737,827 | 4/1988 | Ohta | 357/22 A |
| 4,757,358 | 7/1988 | Hovel et al. | 357/22 A |
| 4,772,925 | 9/1988 | Fukuzawa et al. | 357/22 A |
| 4,795,717 | 1/1989 | Okamura | 437/184 |

FOREIGN PATENT DOCUMENTS

| | | | |
|---|---|---|---|
| 55-95370 | 7/1980 | Japan | 357/22 MD |
| 60-210879 | 10/1985 | Japan | 357/22 MD |
| 61-15375 | 1/1986 | Japan | 357/22 MD |
| 61-59882 | 3/1986 | Japan | 357/22 MD |
| 61-237473 | 10/1986 | Japan | 357/22 MD |
| 0090865 | 4/1988 | Japan | 437/39 |

OTHER PUBLICATIONS

Kim et al, "GaAs/AlGaAs ... 18.5 GHz". IEEE Electron Device Letters, vol EDL-7, No. 11, Nov. 1986, pp. 638–639.

Primary Examiner—Olik Chaudhuri
Assistant Examiner—Long Pham
Attorney, Agent, or Firm—Leydig, Voit & Mayer

[57] ABSTRACT

A compound semiconductor MIS FET includes a channel layer produced on a semi-insulating substrate with an intervening buffer layer, source and drain electrodes produced directly on a predetermined region of the channel layer, and a Schottky barrier gate electrode produced on the channel layer between the source and drain ohmic electrodes and on an undoped semiconductor layer. A production method for such a compound semiconductor MIS FET includes removing by etching undoped semiconductor layer at source and drain electrode production regions to expose a channel layer existing therebelow before producing the source and drain electrodes, and producing ohmic electrodes on the exposed channel layer and producing a Schottky barrier gate electrode between the source and drain electrodes on the undoped layer.

2 Claims, 4 Drawing Sheets

METHOD FOR PRODUCING A COMPOUND SEMICONDUCTOR MIS FET

This application is a divisional of application Ser. No. 07/528,850, filed May 25, 1990 now abandoned.

FIELD OF THE INVENTION

The present invention relates to a compound semiconductor MIS FET and a production method thereof.

BACKGROUND OF THE INVENTION

FIG. 3 is a cross-sectional view showing a prior art GaAs MIS FET disclosed in "IEEE Electron Device Letters, Vol. EDL-7, No. 11". In FIG. 3, reference numeral 1 designates a semi-insulating GaAs substrate. A GaAs buffer layer 2 is disposed on the substrate 1. An n type GaAs channel layer 3 is disposed on the buffer layer 2. An undoped GaAlAs layer 4 is disposed on the channel layer 3. N+ type GaAs contact layers 5 are disposed on the GaAlAs layer 4. Source and drain ohmic electrodes 6 are disposed on the contact layers 5, respectively, and a gate Schottky barrier gate electrode 7 is disposed on GaAlAs layer 4.

A method of producing this GaAs MIS FET will be described hereinafter.

FIG. 4(a) is a cross-sectional view showing a wafer for the GaAs MIS FET produced by MBE. In FIG. 4(a), the same reference numerals as those shown in FIG. 3 designate the same or corresponding portions. The n type GaAs layer 3 functions as a channel of the FET and the undoped GaAsAs layer 4 functions as a gate insulating film.

After producing a wafer as shown in FIG. 4(a), source and drain ohmic electrodes 6 are produced on n+ type GaAs contact layer 5 as shown in FIG. 4(b) by using the lift-off method and an annealing. Thereafter, n+ GaAs contact layer 5 is selectively etched using photoresist as a mask to produce a recess structure, whereby the surface of GaAlAs layer 4 is exposed. Subsequently, Schottky Barrier gate electrode 7 is produced on GaAlAs layer 4 as shown in FIG. 4(c) using the photoresist pattern in the lift-off method.

In the prior art GaAs MIS FET constructed as described above, a high resistance GaAlAs layer is disposed between the n+ type GaAs contact layer 5 directly below the source and drain ohmic electrodes 6, and the n type GaAs layer 3 which functions as a channel layer. Therefore, the FET source resistance Rs and the drain resistance Rd are high and the high frequency characteristics are deteriorated.

In addition, in the selective etching of the n+ type GaAs layer 5 shown in FIG. 4(c), the GaAlAs layer 4 is also etched unfavorably, and this results in variations in element characteristics.

SUMMARY OF THE INVENTION

The present invention is directed to solving the above-described problems and has for its object to provide a compound semiconductor MIS FET that reduces the FET source resistance Rs with maintaining a high breakdown voltage and uniformity of characteristics of MIS FET.

Another object of the present invention is to provide a production method for a compound semiconductor MIS FET that prevents occurrence of unfavorable etching of GaAlAs.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

A compound semiconductor MIS FET according to the present invention includes a source and drain ohmic electrode produced directly on the channel layer. This reduces the parasitic resistance component due to the undoped semiconductor layer and the high frequency characteristics are improved.

In a production method of a compound semiconductor MIS FET according to the present invention, portions of an undoped semiconductor layer where source and drain ohmic electrodes will be produced are removed by etching and ohmic electrodes are produced directly on the n type GaAs layer exposed to the opening. This reduces the FET source resistance Rs and FET drain resistance Rd. In addition, no process is required for recess etching the high carrier density layer at the uppermost surface and variations in the element characteristics are largely reduced.

DETAILED DESCRIPTION OF THE PREFERRED EMBODIMENTS

Figure 1A:
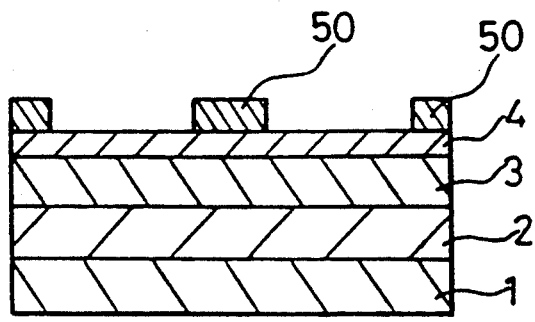
FIGS. 1(a) to 1(f) are cross-sectional views showing process steps for producing a compound semiconductor MIS FET according to an embodiment of the present invention.

Embodiments of the present invention will be described in detail with reference to the drawings.

FIGS. 1(a) to 1(f) are cross-sectional views showing process steps for producing a compound semiconductor MIS FET according to an embodiment of the present invention. In these figures, reference numeral 1 designates a semi-insulating GaAs substrate. A GaAs buffer layer 2 is disposed on the substrate 1. An n type GaAs channel layer 3 is disposed on the buffer layer 2. An undoped GaAlAs layer 4 is disposed on the GaAs layer 3. Reference numeral 50 designates a photoresist pattern having apertures corresponding to the source and drain, reference numeral 60 designates an ohmic contact metal, reference numeral 70 designates a photoresist pattern having an aperture corresponding to the gate, and reference numeral 80 designates a schottky barrier gate electrode.

Production process will be described hereinafter.

Figure 1B:
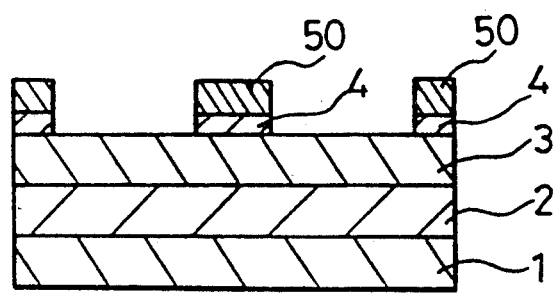
Figure 1C:
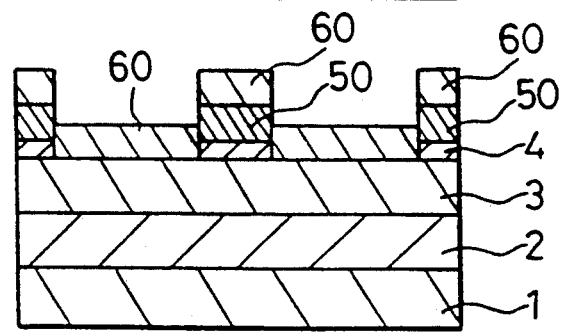
Figure 1D:
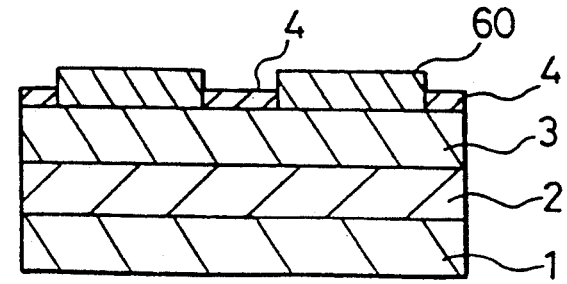
Figure 1E:
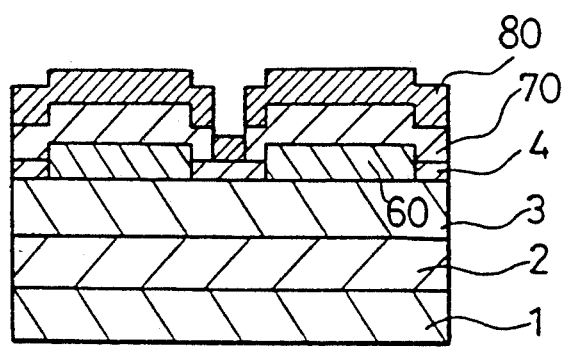
Figure 1F:
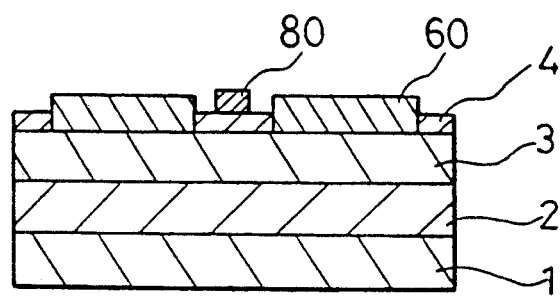

First of all, a GaAs buffer layer 2, an n type GaAs layer 3, and an undoped GaAlAs layer 4 are successively grown on a semi-insulating GaAs substrate 1 by an epitaxial growth method, for example, MBE, MOCVD, or LPE. Herein, n type GaAs layer 3 has a carrier density of $6 \times 10^{17}$ cm$^{-3}$ and thickness of 0.06 micron so as to obtain a desired $I_{DSS}$ (current value flowing through the FET when the gate voltage is 0), a desired $g_m$ (mutual conductance), and a desired $V_p$ (pinch-off voltage) when a Schottky barrier gate electrode is produced in a later process. Next, a photoresist is plated on the wafer, and a photoresist pattern 50 having apertures corresponding to the source and drain ohmic electrode production regions is produced by a usual photolithography technique as shown in FIG. 1(a). Then, as shown in FIG. 1(b), undoped GaAlAs layer 4 which brings an increase of the source resistance Rs and drain resistance Rd is etched using the photoresist 50 as a mask, whereby n type GaAs channel layer 3 is exposed. This etching is not necessarily stopped at the surface of the n type GaAs channel layer 3. However, when the etching is stopped at the surface of the n type GaAs channel layer 3 by adopting a selective etch, variation of the current leakage characteristics can be prevented. As a selective etch for etching the GaAlAs layer and not for etching the GaAs layer, wet etching utilizing fluoric acid solution is well known. Subsequently, an ohmic contact metal 60, such as AuGe/Ni, is deposited on the entire surface of the wafer by an evaporation method as shown in FIG. 1(c). Then, unnecessary portions of the metal 60 are removed by the lift-off method as shown in FIG. 1(d), and thereafter, annealing is performed in an $H_2$ ambient at 380° C. for five minutes, thereby obtaining a good ohmic contact characteristics. Thereafter, a photoresist pattern 70 having an aperture portion corresponding to the gate electrode production region is produced, and a Schottky barrier gate metal, such as Ti/Au, is deposited on the entire surface by an evaporation method as shown in FIG. 1(e). Then, unnecessary portions of the metal are removed by the lift-off method, thereby completing a MIS FET shown in FIG. 1(f).

As described above, the undoped semiconductor layer below the source and drain ohmic electrodes which causes parasitic resistance is removed by etching and ohmic electrodes are produced on the n type GaAs channel layer exposed to said region. Therefore, the FET source resistance Rs and FET drain resistance Rd are reduced and no process is required for recess etching the high carrier density layer at the uppermost surface, resulting in a reduction of variations in the element characteristics.

FIGS. 2(a) to 2(d) are cross-sectional views showing process steps for producing a compound semiconductor MIS FET according to a second embodiment of the present invention. In these figures, the same reference numerals as those shown in FIG. 1 designate the same or corresponding portions.

In this second embodiment, after producing a schottky barrier gate electrode, the undoped GaAlAs layer is etched.

A production process will be described hereinafter.

Figure 2A:
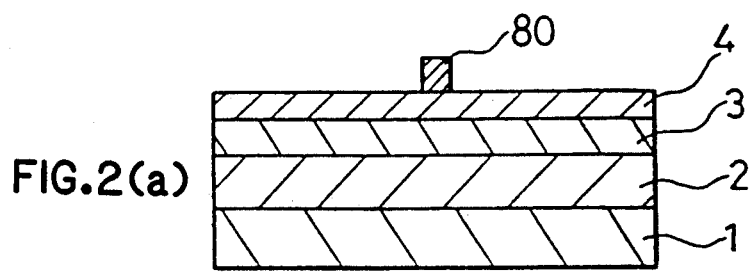
FIGS. 2(a) to 2(d) are cross-sectional views showing process steps for producing a compound semiconductor MIS FET according to another embodiment of the present invention.
Figure 2B:
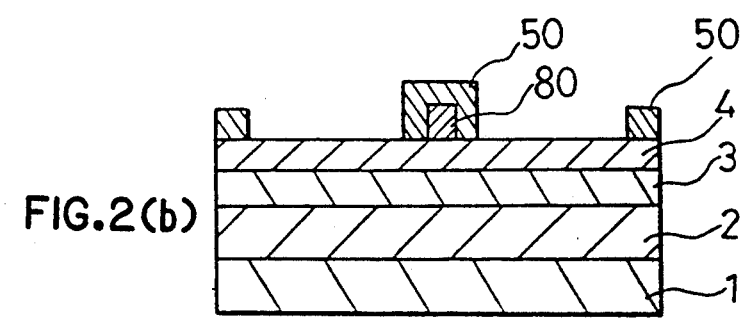
Figure 2C:
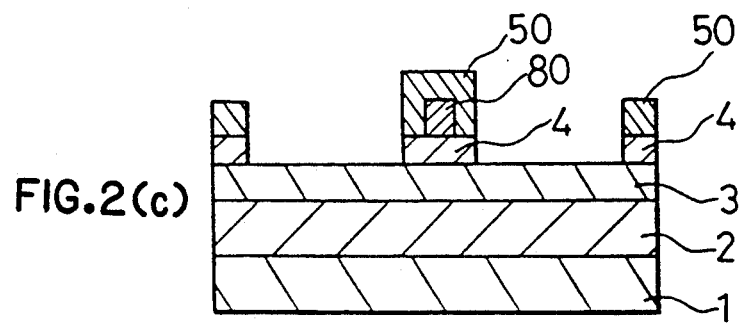
Figure 2D:
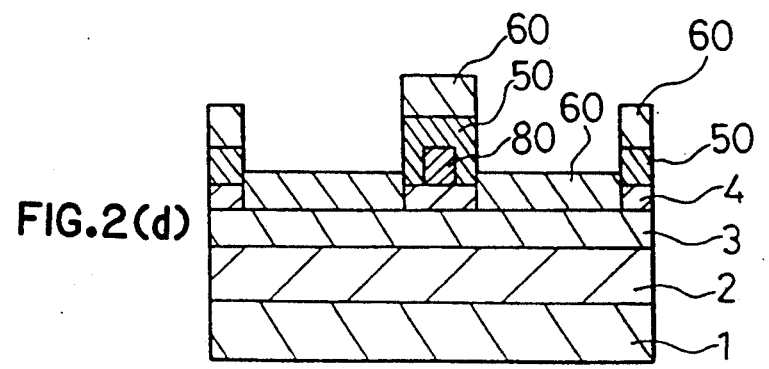
Figure 3:
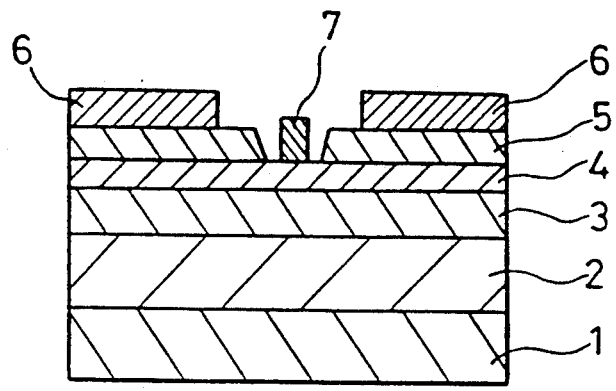
FIG. 3 is a cross-sectional view showing a prior art MIS FET.
Figure 4A:
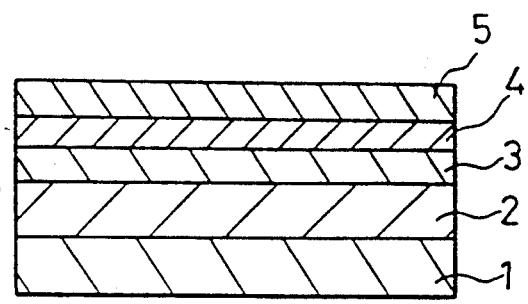
FIGS. 4(a) to 4(c) are cross-sectional views showing process steps for producing the prior art MIS FET.
Figure 4B:
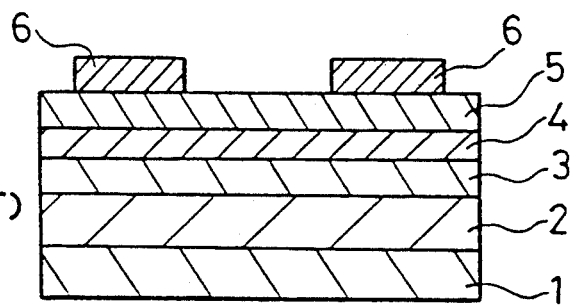
Figure 4C:
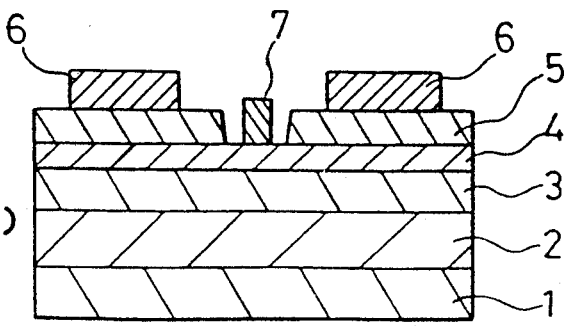

First of all, similarly as in the first embodiment, a GaAs buffer layer 2, an n type GaAs layer 3, and an undoped GaAlAs layer 4 are successively grown on a semi-insulating GaAs substrate 1 by an epitaxial growth method, for example, MBE, MOCVD, or LPE. Thereafter, a photoresist is plated on the wafer, and a photoresist pattern having aperture corresponding to the schottky barrier gate electrode production region is produced by a usual photolithography technique. Next, a schottky barrier gate metal, such as Ti/Au, is deposited on the entire surface by evaporation method, and unnecessary portions of the metal are removed by the lift-off method to produce a gate electrode 80 as shown in FIG. 2(a). Next, photoresist is again plated on the entire surface of the wafer, and a photoresist pattern 50 having apertures corresponding to the source and drain ohmic electrodes production regions is produced by a usual photolithography technique as shown in FIG. 2(b). Then, as shown in FIG. 2(c), undoped GaAlAs layer 4 is etched using the photoresist 50 as a mask, thereby to expose the surface of n type GaAs channel layer 3. Then, an ohmic metal 60, such as AuGe/Ni, is deposited on the entire surface by an evaporation method, and the unnecessary portions of the metal are removed by the lift-off method, thereby completing a MIS FET shown in FIG. 1(f).

In this second embodiment, the undoped GaAlAs layer directly below the source and drain ohmic electrodes which causes parasitic resistance is removed by etching and ohmic electrodes are produced on the n type GaAs channel layer exposed to said region. Therefore, the parasitic resistance is reduced and no process is required for recess etching, resulting in a reduction of variations in the element characteristics.

While in the above-described first and second embodiments the undoped semiconductor layer comprises GaAlAs, this may comprise any material which can be epitaxially grown on GaAs, for example, GaInAs.

As is evident from the foregoing description, according to the present invention, a compound semiconductor MIS FET includes source and drain ohmic electrodes produced directly on the channel layer. Therefore, the parasitic resistance component due to the undoped semiconductor layer is reduced and the high frequency characteristics are improved.

According to a production method for a compound semiconductor MIS FET, an undoped semiconductor layer below the source and drain ohmic electrodes is removed by etching and ohmic electrodes are produced directly on the n type GaAs channel layer exposed to the opening. Therefore, the FET source resistance Rs and FET drain resistance Rd which arise in the current path between the source and drain ohmic electrodes to the channel region are largely reduced. In addition, since no process is required for recess etching the high carrier density layer at the uppermost surface, variations in the element characteristics are largely reduced. Thus, the high frequency characteristics of the MIS FET are improved.

What is claimed is:

1. A method for producing a compound semiconductor MISFET comprising sequentially:

successively epitaxially growing on a semiconductor substrate a buffer layer, a channel layer, and an undoped semiconductor layer;

depositing a first photoresist film on said undoped semiconductor layer and producing spaced apart apertures in said first photoresist film corresponding to source and drain regions;

using said first photoresist film as a mask, etching and thereby removing portions of said undoped semiconductor layer at said source and drain regions thereby exposing said channel layer;

producing source and drain electrodes by depositing an electrode metal on said first photoresist film and on said exposed channel layer at said source and drain regions and thereafter removing said first photoresist film;

depositing a second photoresist on said undoped semi-conductor layer and said source and drain electrodes and patterning said second photoresist film to produce an aperture corresponding to a Schottky barrier gate electrode region; and producing a Schottky barrier gate electrode by depositing a metal on the second photoresist film and on said gate electrode region on said undoped semiconductor layer between and spaced from said source and drain regions and thereafter removing said second photoresist film.

2. A production method of a compound semiconductor MIS FET as defined in claim 1 wherein said substrate comprises semi-insulating GaAs, said buffer layer comprises GaAs, said channel layer comprises n type GaAs, and said undoped semiconductor layer comprises GaAlAs.

* * * * *